(12) United States Patent
Richards et al.

(10) Patent No.: US 10,673,218 B2
(45) Date of Patent: Jun. 2, 2020

(54) MOLDED ELECTRICAL JUNCTION BOX

(71) Applicant: Thomas & Betts International LLC, Wilmington, DE (US)

(72) Inventors: Gregory Brian Richards, Germantown, TN (US); Charles C. Britton, Germantown, TN (US)

(73) Assignee: Thomas & Betts International LLC, Wilmington, DE (US)

( * ) Notice: Subject to any disclaimer, the term of this patent is extended or adjusted under 35 U.S.C. 154(b) by 112 days.

(21) Appl. No.: 16/059,452

(22) Filed: Aug. 9, 2018

(65) Prior Publication Data

US 2019/0058316 A1    Feb. 21, 2019

Related U.S. Application Data

(60) Provisional application No. 62/546,633, filed on Aug. 17, 2017.

(51) Int. Cl.
| | | |
|---|---|---|
| *H02G 3/16* | (2006.01) | |
| *C08L 67/06* | (2006.01) | |
| *H02G 3/18* | (2006.01) | |
| *H05K 5/02* | (2006.01) | |
| *H02G 3/12* | (2006.01) | |
| *H02G 3/08* | (2006.01) | |

(52) U.S. Cl.
CPC ............ *H02G 3/16* (2013.01); *C08L 67/06* (2013.01); *H02G 3/12* (2013.01); *H02G 3/18* (2013.01); *H05K 5/0217* (2013.01); *H02G 3/081* (2013.01)

(58) Field of Classification Search
None
See application file for complete search history.

(56) References Cited

U.S. PATENT DOCUMENTS

| | | | | |
|---|---|---|---|---|
| 2,924,639 | A * | 2/1960 | Zelt | ............... H02G 3/16 174/50 |
| 3,015,408 | A | 1/1962 | Campbell et al. | |
| 3,263,853 | A * | 8/1966 | Smith | ............... E04F 19/08 174/37 |
| 3,334,770 | A * | 8/1967 | Stanback | ............... H01H 9/02 174/67 |
| 3,701,451 | A * | 10/1972 | Schindler | ............... H02G 3/085 220/277 |
| 3,740,451 | A * | 6/1973 | Schindler | ............... H02G 3/085 174/58 |
| 3,862,351 | A * | 1/1975 | Schindler | ............... H02G 3/126 174/58 |
| 3,863,021 | A * | 1/1975 | Schindler | ............... H02G 3/085 174/53 |
| 4,081,578 | A * | 3/1978 | van Essen | ............... B29C 37/0028 264/247 |
| 4,163,503 | A | 8/1979 | McKinnon | |

(Continued)

*Primary Examiner* — Timothy J Thompson
*Assistant Examiner* — Muhammed Azam
(74) *Attorney, Agent, or Firm* — Taft Stettinius & Hollister LLP

(57) ABSTRACT

A molded electrical junction box may be formed from a high-heat thermoset polyester. The box includes a back wall, a parametrical side wall bounding the back wall and an open front face. The back wall includes an integrally molded rib pattern extending therefrom. The rib pattern increases the thickness of the back wall thereat. The rib pattern is formed to be in direct flow communication with a molding gate during the molding process.

14 Claims, 4 Drawing Sheets

(56) References Cited

U.S. PATENT DOCUMENTS

| | | | |
|---|---|---|---|
| 4,626,617 A * | 12/1986 | Rye | H02G 3/126 174/53 |
| 4,673,097 A | 6/1987 | Schuldt | |
| 4,758,687 A * | 7/1988 | Lathrop | H02G 3/18 174/53 |
| 5,084,596 A | 1/1992 | Borsh et al. | |
| D335,279 S * | 5/1993 | Parduhn | D13/118 |
| 5,276,279 A * | 1/1994 | Brownlie | H02G 3/10 174/50 |
| 5,352,850 A * | 10/1994 | Norris | H02G 3/16 174/51 |
| 5,359,152 A | 10/1994 | Hone-Lin | |
| 5,579,938 A * | 12/1996 | Bourassa | H02G 3/083 174/665 |
| 5,594,208 A * | 1/1997 | Cancellieri | H02G 3/10 174/58 |
| 5,762,385 A | 6/1998 | Mader et al. | |
| 5,804,764 A * | 9/1998 | Gretz | H02G 3/14 174/53 |
| 5,837,938 A | 11/1998 | Sakamoto | |
| D411,308 S * | 6/1999 | Pandey | D24/216 |
| 6,545,217 B2 | 4/2003 | Sato | |
| 7,126,058 B2 | 10/2006 | Herth | |
| 7,179,990 B2 * | 2/2007 | Kanazawa | H02G 3/088 174/50 |
| 7,667,145 B2 * | 2/2010 | Dinh | H02G 3/123 174/480 |
| 7,699,623 B2 * | 4/2010 | Yoshida | H02G 3/081 174/50 |
| RE41,661 E * | 9/2010 | Dinh | H02G 3/088 174/480 |
| 8,253,016 B1 | 8/2012 | Baldwin et al. | |
| 8,269,103 B2 | 9/2012 | Kiyota | |
| 8,537,565 B2 * | 9/2013 | Miyamoto | H02G 3/086 174/50 |
| 8,907,214 B1 | 12/2014 | Baldwin et al. | |
| 8,921,714 B2 * | 12/2014 | Haberek | H02G 3/123 174/560 |
| D724,236 S * | 3/2015 | Motadel | D24/227 |
| 9,077,166 B2 * | 7/2015 | Dinh | H02G 3/088 |
| 9,178,346 B2 * | 11/2015 | Shimizu | H02G 3/083 |
| 9,537,295 B2 * | 1/2017 | Dinh | H02G 3/088 |
| 10,090,654 B1 * | 10/2018 | Like | H02G 3/083 |
| 2001/0001424 A1 * | 5/2001 | Sasaoka | H02S 40/34 174/50 |
| 2003/0095382 A1 * | 5/2003 | Takedomi | B60K 1/04 361/688 |
| 2003/0102143 A1 * | 6/2003 | Sato | H02G 3/088 174/663 |
| 2005/0194167 A1 * | 9/2005 | Kiyota | H02G 3/081 174/17 VA |
| 2005/0230398 A1 * | 10/2005 | Hasegawa | H01L 21/67373 220/323 |
| 2006/0196534 A1 * | 9/2006 | Takada | H01R 9/2425 136/244 |
| 2006/0249306 A1 * | 11/2006 | Dinh | H02G 3/123 174/481 |
| 2006/0264163 A1 * | 11/2006 | Fioratti | B24D 3/28 451/540 |
| 2006/0278171 A1 * | 12/2006 | Conger | A01K 1/0356 119/419 |
| 2007/0145050 A1 | 6/2007 | Washihira | |
| 2007/0181070 A1 * | 8/2007 | Conger | A01K 1/031 119/61.5 |
| 2008/0017413 A1 * | 1/2008 | Dinh | H02G 3/123 174/481 |
| 2008/0248227 A1 * | 10/2008 | Sumimoto | B65D 25/107 428/35.7 |
| 2009/0098748 A1 * | 4/2009 | Ikeda | H01R 9/2425 439/76.1 |
| 2010/0012371 A1 * | 1/2010 | Solan | H02G 3/123 174/502 |
| 2010/0084155 A1 * | 4/2010 | Jafari | H02G 3/123 174/58 |
| 2010/0307814 A1 * | 12/2010 | Aoki | B60R 16/0238 174/520 |
| 2010/0326690 A1 * | 12/2010 | Ejima | B60R 16/0238 174/50 |
| 2011/0076901 A1 * | 3/2011 | Glick | H01R 9/245 439/839 |
| 2012/0006594 A1 * | 1/2012 | Takeuchi | H01R 13/506 174/520 |
| 2012/0051022 A1 * | 3/2012 | Dong | G02F 1/133308 361/807 |
| 2014/0234182 A1 * | 8/2014 | Motadel | B01L 9/543 422/526 |
| 2015/0014016 A1 * | 1/2015 | Kakoi | B60R 16/0238 174/59 |
| 2017/0080881 A1 * | 3/2017 | Ooi | B60R 16/0238 |
| 2019/0067925 A1 * | 2/2019 | Tsuchida | H01F 27/027 |

\* cited by examiner

MOLDED ELECTRICAL JUNCTION BOX

CROSS-REFERENCE TO RELATED APPLICATION

This application claims priority to U.S. Provisional Patent Application No. 62/546,633, filed on Aug. 17, 2017, the contents of which are incorporated herein by reference in its entirety.

FIELD OF THE INVENTION

The present invention relates generally to electrical junction boxes for supporting electrical devices such as outlets, switches and other components. More particularly, the present invention relates to a molded electrical junction box formed of a thermoset resin having a rib pattern molded thereon to improve moldability and structural integrity.

BACKGROUND OF THE INVENTION

Molded plastic electrical junction boxes are well known in the electrical industry. These junction boxes house various electrical termination components such as switches and outlets and permit electrical wires to be connected to the components therein.

Applicable electrical standard groups require the electrical junction box to meet certain strength and fire resistant requirements. As a result of these requirements, junction boxes of this type may have to be formed having relatively thick walls. This, of course, increases the cost of the junction box due to increased materials and manufacturing costs.

These problems are especially prevalent when forming the junction box of a fire resistant compound. Attempts to reduce the wall thickness of junction boxes formed of such a fire rated compound results in the box being brittle and failing the requisite standards for strength. Moreover, it has been found that it is difficult to mold the entire box from these fire rated compounds as the material flow characteristics of the compound result in knit lines being formed on the side walls as the material flows from the back wall to adjacent side walls of the box. Thus, use of fire rated materials to form a molded junction box results in the need to form the box of increased thickness thereby increasing the cost of the box.

SUMMARY OF THE INVENTION

The present invention provides a molded electrical box. The box includes a plurality of box walls defining a box interior and an open face. A rib pattern is integrally molded in at least one of the box walls. The rib pattern increases the thickness of the wall thereat. The rib pattern is positioned for flow communication a molding gate during the molding process.

More particularly, the present invention provides a molded electrical box comprising a back wall and a perimetrical side wall bounding the back wall. An open front face is opposite the back wall. The back wall includes an integrally molded rib pattern extending therefrom. The rib pattern increases the thickness of the back wall thereat. The rib pattern is positioned for flow communication with a molding gate during the molding process. The rib pattern includes a plurality of ribs intersecting on the back wall of the box.

The molded box may be formed from high-heat thermoset polyester.

DETAILED DESCRIPTION OF THE PREFERRED EMBODIMENT

Figure 1:
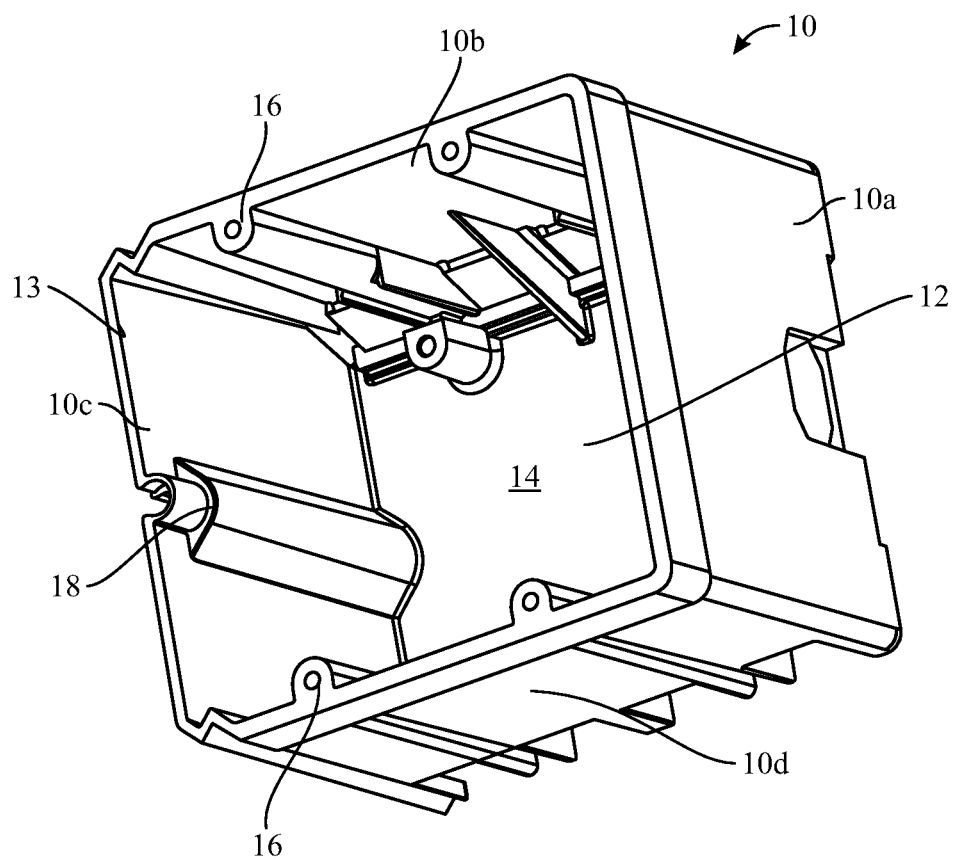
FIG. 1 is a front perspective showing of the molded electrical box of the present invention.

The present invention provides an electrical box which may be molded, for example, with a fire rated material without need to increase the thickness of the box and avoid problems inherent in injection molding such material.

Referring to the figures, an electrical box in accordance with the present invention is shown. Electrical box 10 is of generally standard construction having a back wall 12 and a parametrical side wall 14 extending from the back wall 12. The parametrical side wall in the present instance includes four side walls 10a-10d and defines at the end opposite back wall 12 an open front face 13. The back wall 12 and side walls 10a-10d define a box interior 14. The interior 14 of box 10, as is well known in the art, may house various electrical termination devices such as switches and outlets.

In the present illustrative embodiment, a two gang square electrical box is shown. However, other sizes, shapes and configurations of electrical boxes may be practiced in accordance with the present invention. As is also well known, the side walls 10a and 10d may include mounting structure 16 extending inwardly therefrom to permit the mounting of the electrical components such as switches and receptacles thereto. As shown in the present example, side wall 10c may include additional attachment structure 18 which may be used to secure a mounting bracket (not shown) thereto so as to secure the box to a stud or the like.

As will be described in detail hereinbelow, the box of the present invention is designed to be formed from a high-heat fiberglass reinforced thermoset polyester. Such thermoset resins have different flow characteristics than conventional thermoplastic resins. In prior art boxes of this type, in order to assure proper flow, and also to provide the strength characteristics required applicable standards, the walls of such a box must be made relatively thick. This results in an unacceptable increase in the cost of the box. While high-heat fiberglass reinforced thermoset polyester is particularly advantageous in the present invention, it may be appreciated that the box of the present invention may be formed from a wide variety of plastics.

The present invention allows the box to be formed from such high-heat fiberglass reinforced thermoset polyesters without unduly increasing the entire wall thickness of the box. Also, the present invention results in the reduction in knit lines caused by the attempt to injection mold such thermoset resins.

Figure 2:
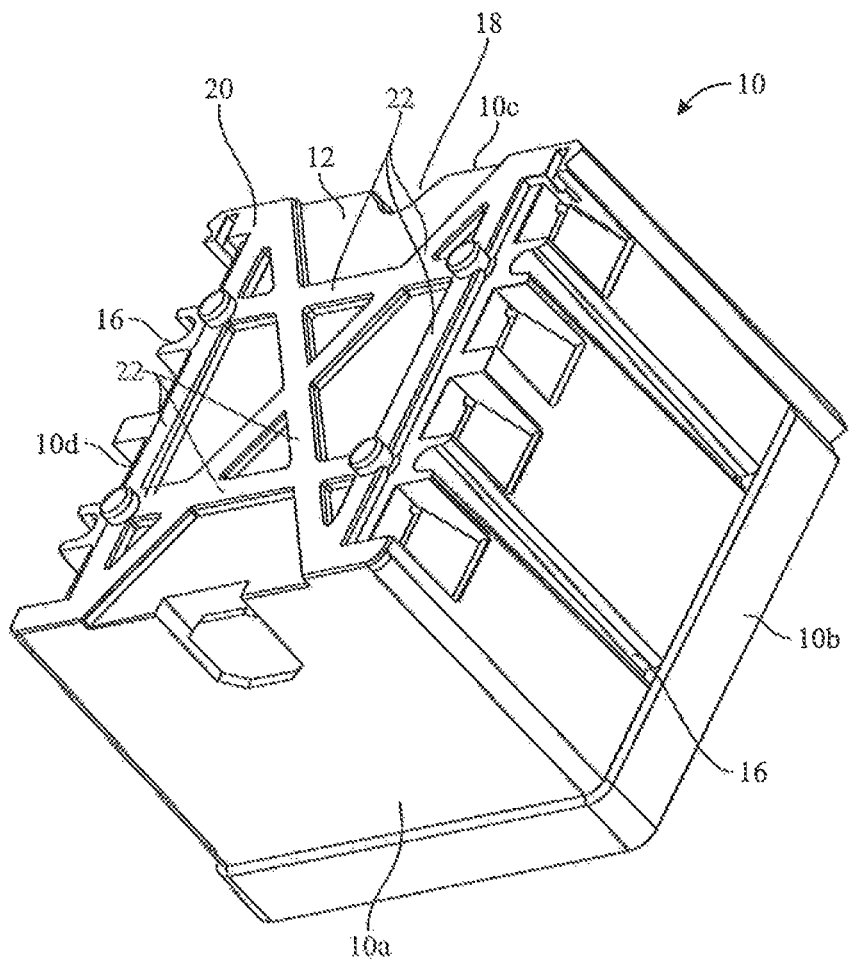
FIGS. 2 and 3 are rear perspective showings of the electrical box of FIG. 1.
Figure 3:
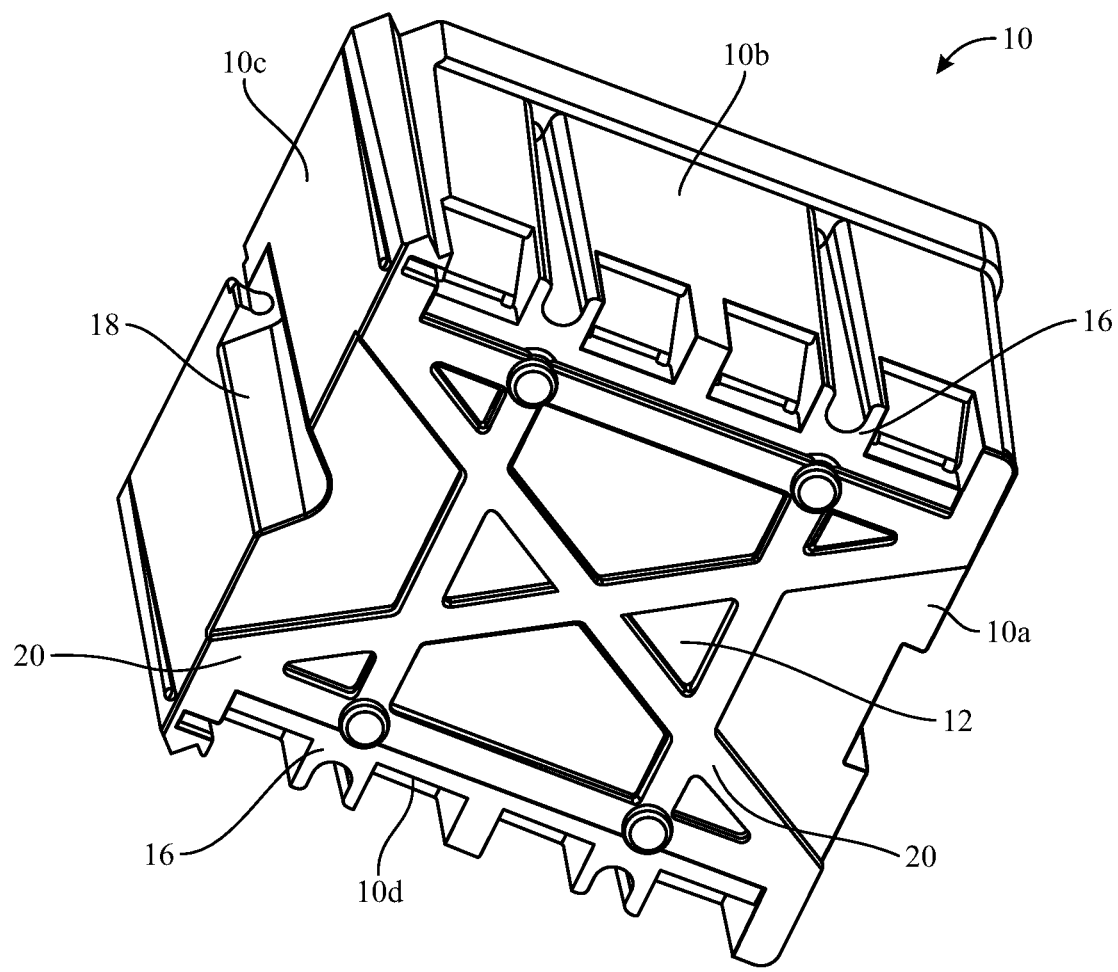
Figure 4:
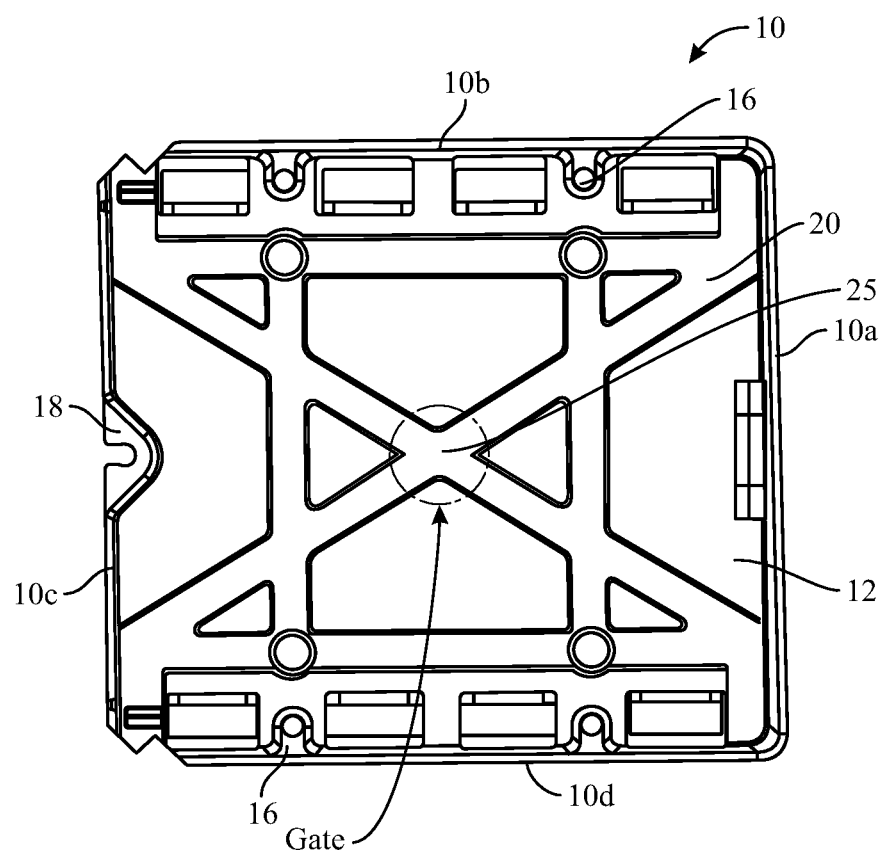
FIG. 4 is a rear plan view of the electrical box of FIG. 1.

The improved electrical junction box 10 of the present invention and its formation technique may further be described with respect to FIGS. 2-4. The box 10 of the present invention is injection molded from a high-heat fiberglass reinforced thermoset polymer. The box 10 itself is formed to have side walls 10a-10d and a back wall 12 of conventional thickness without need to increase the thickness of the walls 10a-10d, 12 for either strength or moldability purposes. This is achieved by molding a rib pattern 20 on the back wall 12 of box 10. Rib pattern 20 includes a plurality of intersecting ribs 22 which are formed on the back wall 12 of the box 10 and extend outwardly and rearwardly therefrom. The rib pattern 20 increases the thickness of the back wall 12 only at the rib pattern 20 itself. This results in the use of less materials which would normally be necessary to achieve the strength required by applicable standards. The intersecting rib pattern 20 on back wall 12 provides structural stability to the box 10 by stiffening the box 10. Thus, increased strength and stability is provided without having to increase the entire wall thickness of the back all 12 or the side walls 10. When using a fire rated high-heat fiberglass reinforced material, this results in significant cost savings.

Moreover, the particular rib pattern 20 shown in FIGS. 2-4 results in significant advantages with respect to moldability. Without the rib pattern 20, it has been found that in the use of materials such as a fiberglass reinforced thermoset polyester resin, the material flow characteristics of the resin is such that knit lines are formed on the side walls 10*a-d* as the materials flows from the back to adjacent side walls 10*a-d*. The particular rib pattern 20 shown in FIGS. 2-4 serves a runner for the material from the gate shown schematically at location 25 to each of the side wall 10*a*-10*d*. The entire rib structure 20 is in flow communication with the molding gate so that the molded material may flow through the side walls 10*a-d* through the individual ribs 22 reducing moldability problems.

It is contemplated that the present invention allows use of a wall thickness of 0.08 inches with the presently contemplated material. Without such rib structure, wall thicknesses of 0.15 inches would be required to achieve the same moldability and strength characteristics.

Various changes to the foregoing described and shown structures would now be evident to those skilled in the art. Accordingly, the particularly disclosed scope of the invention is set forth in the following claims.

What is claimed is:

1. A molded electrical box comprising:
   a back wall;
   a parametrical side wall bounding said back wall;
   an open front face opposite said back wall;
   said back wall including an integrally molded rib pattern extending therefrom, said rib pattern increasing a thickness of said back wall at said rib pattern, said rib pattern being positioned for direct flow communication with a molding gate during a molding process, wherein said rib pattern includes a plurality of ribs intersecting on said back wall of said box.

2. A molded electrical box comprising:
   a plurality of box walls defining a box interior and an open face;
   a rib pattern integrally molded in at least one wall of the plurality of box walls, the rib pattern including a first set of ribs, a second set of ribs, and a third set of ribs, the first set of ribs extending in a direction that is parallel to at least one set of walls of the plurality of box walls, each rib of the third set of ribs extending in a direction that is different from a direction of each rib of the first set of ribs and the second set of ribs,
   wherein the first set of ribs are adjoined to the second set of ribs,
   wherein each rib of the third set of ribs is adjoined to at least one rib of each of the first set of ribs and the second set of ribs,
   wherein each rib of the first set of ribs is adjoined to a rib of the second set of ribs at a location that is different than a location at which each rib of the first set of ribs is adjoined to a rib of the third set of ribs.

3. A molded electrical box of claim 1 wherein said back wall and said side wall define a box interior and the said rib pattern on said back wall extends external of said box interior.

4. A molded electrical box of claim 1 wherein said box is molded from a high-heat thermoset polyester.

5. A molded electrical box comprising:
   a plurality of box walls defining a box interior and an open face;
   a rib pattern integrally molded in at least one side box wall said rib pattern increasing a thickness of a side at least one wall thereat, said rib pattern being positioned for direct flow communication with a molding gate during a molding process, the rib pattern comprising one or more ribs that extend diagonally across a portion of at the at least one box wall of the plurality of box walls and one or more ribs that extend non-diagonally across another portion of the at least one box wall.

6. A molded electrical box of claim 5 wherein said rib pattern includes a plurality of intersecting ribs.

7. A molded electrical box of claim 5 wherein said box is molded from a high-heat thermoset polyester.

8. The molded electrical box of claim 2, wherein the first set of ribs extend in a direction that is generally non-perpendicular to the second set of ribs.

9. The molded electrical box of claim 2, wherein the first set of ribs extend in a direction that is generally perpendicular to the second set of ribs.

10. The molded electrical box of claim 8, wherein the first set of ribs and the second set of ribs are each positioned on an exterior portion of the at least one wall.

11. The molded electrical box of claim 10, wherein the at least one wall is a base wall that is positioned at a location that opposes the open face.

12. The molded electrical box of claim 2, wherein each rib of the first set of ribs is offset away from an adjacent wall of the at least one set of walls of the plurality of box walls.

13. The molded electrical box of claim 2, wherein the first set of ribs, the second set of ribs, and the third set of ribs are each positioned on an exterior portion of the at least one wall.

14. The molded electrical box of claim 13, wherein the at least one wall is a base wall that is positioned at a location that opposes the open face.

\* \* \* \* \*